United States Patent [19]

Suzuki et al.

[11] Patent Number: 4,883,429
[45] Date of Patent: Nov. 28, 1989

[54] ELECTRONIC DEVICE PACKAGING STRUCTURE

[75] Inventors: Takao Suzuki, Ohme; Kouzou Uekido, Tokyo, both of Japan

[73] Assignees: Japan Aviation Electronics Industry, Limited; NEC Corporation, both of Tokyo, Japan

[21] Appl. No.: 302,167

[22] Filed: Jan. 25, 1989

[30] Foreign Application Priority Data

Feb. 3, 1988 [JP] Japan ............................. 63-13389[U]

[51] Int. Cl.$^4$ .............................................. H01R 9/90
[52] U.S. Cl. ...................................... 439/74; 361/413
[58] Field of Search ....................... 439/65, 66, 74, 75, 439/55, 310, 347, 31; 361/413, 412

[56] References Cited

U.S. PATENT DOCUMENTS

| | | | |
|---|---|---|---|
| 4,498,717 | 2/1985 | Reimer | 361/413 X |
| 4,514,784 | 4/1985 | Williams | 439/74 X |
| 4,573,753 | 3/1986 | Vogl | 439/65 |
| 4,686,607 | 8/1987 | Johnson | 361/413 |
| 4,689,721 | 8/1987 | Dameron et al. | 361/413 X |
| 4,733,461 | 3/1988 | Nakano | 439/74 X |

FOREIGN PATENT DOCUMENTS 472484 9/1975 U.S.S.R. .............................. 361/413

Primary Examiner—William Briggs
Attorney, Agent, or Firm—Pollock, VandeSande and Priddy

[57] ABSTRACT

An electronic device packaging structure, in which a plurality of electronic circuit packages are arrayed on one side of a back panel with their signal input/output terminals projecting out onto the other side of the panel and each connected to one end of one of plural wiring cables. The other ends of the wiring cables are connected to relay connectors, which are fixed to a common frame, constituting a back panel system. A pair of such back panel systems are detachably coupled together via the relay connectors.

4 Claims, 4 Drawing Sheets

ELECTRONIC DEVICE PACKAGING STRUCTURE

BACKGROUND OF THE INVENTION

The present invention relates to an electronic device packaging structure for packaging electronic circuit packages in a data processor or electronic computer, for instance.

With a conventional electronic device packaging structure, one logical function block is constructed using two back panels as shown in FIGS. 1 and 2. Two back panels 11a and 11b, each carrying a plurality of electronic circuit packages 12 on the outside thereof, are disposed opposite with a frame 13 interposed therebetween. The back panels 11a and 11b are interconnected by cables 14 via connectors 15 provided on the back panels at the peripheral portions thereof.

According to this conventional electronic device packaging structure, the length of package wiring, l, for signal connection between a point Q on the back panel 11a and a point R on the back panel 11b is the sum of wiring pattern lengths $l_1$ and $l_2$ from the points Q and R to the connectors 15 on the marginal portions of the back panels 11a and 11b and the length $l_3$ of the cable 14 interconnecting the connectors 15, that is, $l = l_1 + l_2 + l_3$. Thus the prior art package structure has the defect that the package wiring length l is long. The wiring patterns are not straight in practice and their lengths $l_1$ and $l_2$ are usually appreciably greater than in the case where they are straight. This constitutes an obstacle to the implementation of high-speed electronic devices.

SUMMARY OF THE INVENTION

It is therefore an object of the present invention to provide a package structure which affords the reduction of the package wiring for interconnecting electronic circuit packages mounted on two back panels.

According to the present invention, a plurality of electronic circuit packages are mounted on one side of a back panel with their signal input/output terminals projecting out onto the other side of the back panel and female connectors are coupled to the signal input/output terminals. Wiring cables are connected at one end to the female connectors and at the other ends to relay connectors which are fixed to a frame. The frame has through holes through which the wiring cables pass. The frame is fixed to the back panel, constituting a back panel system. A pair of such back panel systems are coupled together via their relay connectors detachably connected.

Thus the present invention interconnects the back panels between their opposed surfaces, and hence permits the reduction of the package wiring length therebetween.

DESCRIPTION OF THE PREFERRED EMBODIMENT

Figure 3:
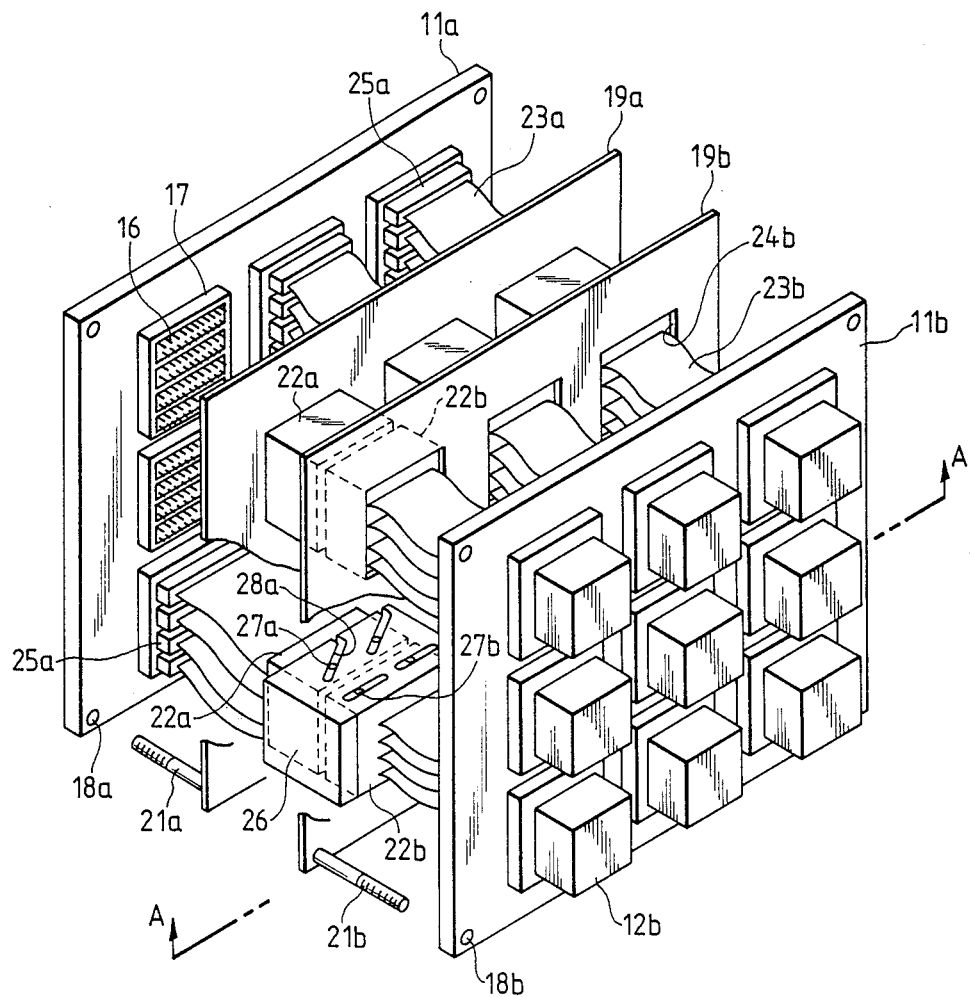
FIG. 3 is a perspective view illustrating an embodiment of the present invention.
Figure 4:
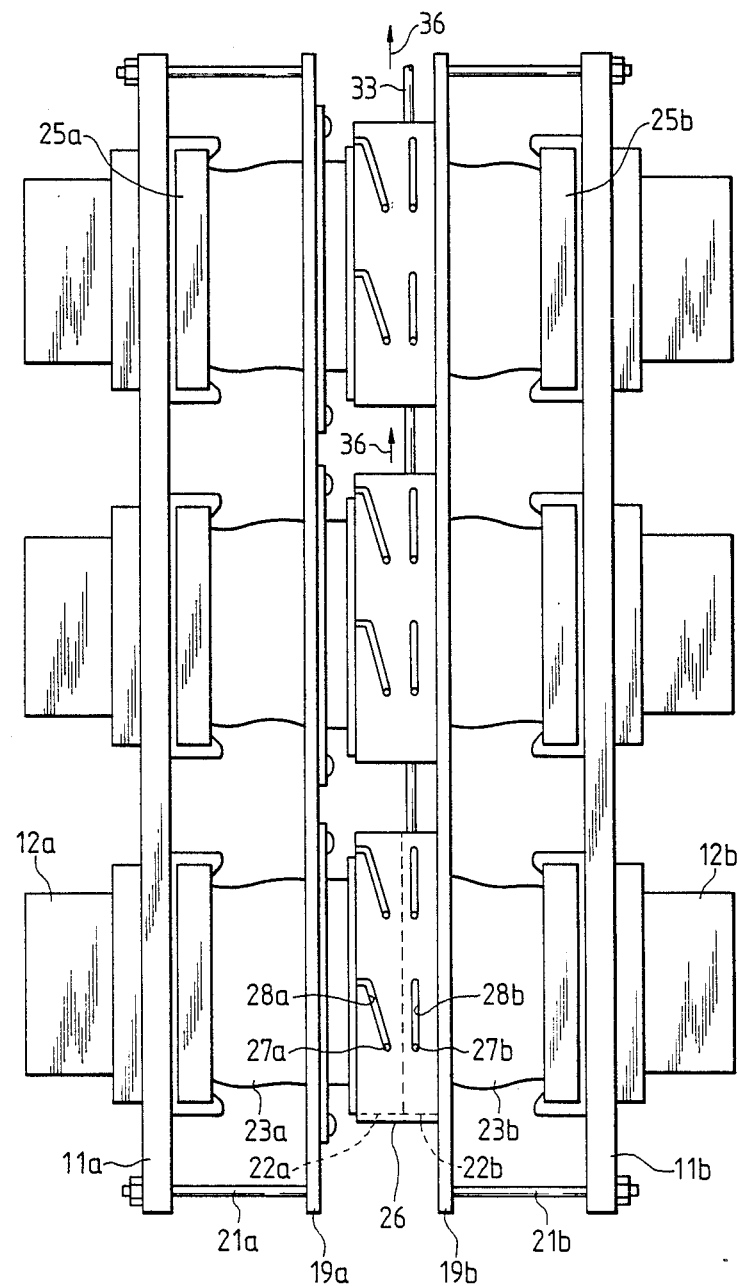
FIG. 4 is a sectional view taken on the line A—A in FIG. 3.

FIGS. 3 and 4 illustrate an embodiment of the present invention. The back panels 11a and 11b have mounted on one side thereof pluralities of electronic circuit packages 12a and 12b, respectively, with their signal input/output terminals 16 projecting out onto the other sides of the back panels 11a and 11b. The signal input/output terminals 16 are surrounded by protective frames 17.

Frames 19a and 19b disposed opposite the back panels 11a and 11b are fixed thereto, respectively, by inserting fixing posts 21a and 21b of the frames 19a and 19b into holes 18a and 18b made in the back panels 11a and 11b at four corners thereof and tightening them. The frames 19a and 19b have relay connectors 22a and 22b fixedly mounted thereon and flat cables 23a and 23b are connected at one end to the relay connectors 22a and 22b. In the frames 19a and 19b there are made through holes 24a and 24b (the through hole 24a being not shown) through which the flat cables 23a and 23b are passed, respectively. The other ends of the flat cables 23a and 23b are connected to female connectors 25a and 25b, which are connected to the signal input/output terminals 16 of the electronic circuit packages 12a and 12b, respectively. The relay connectors 22a and 22b, the flat cables 23a and 23b, and the female connectors 25a and 25b constitute connection wiring. This connection wiring, the back panels 11a and 11b, and the frames 19a and 19b form two back panel systems.

Figure 5:
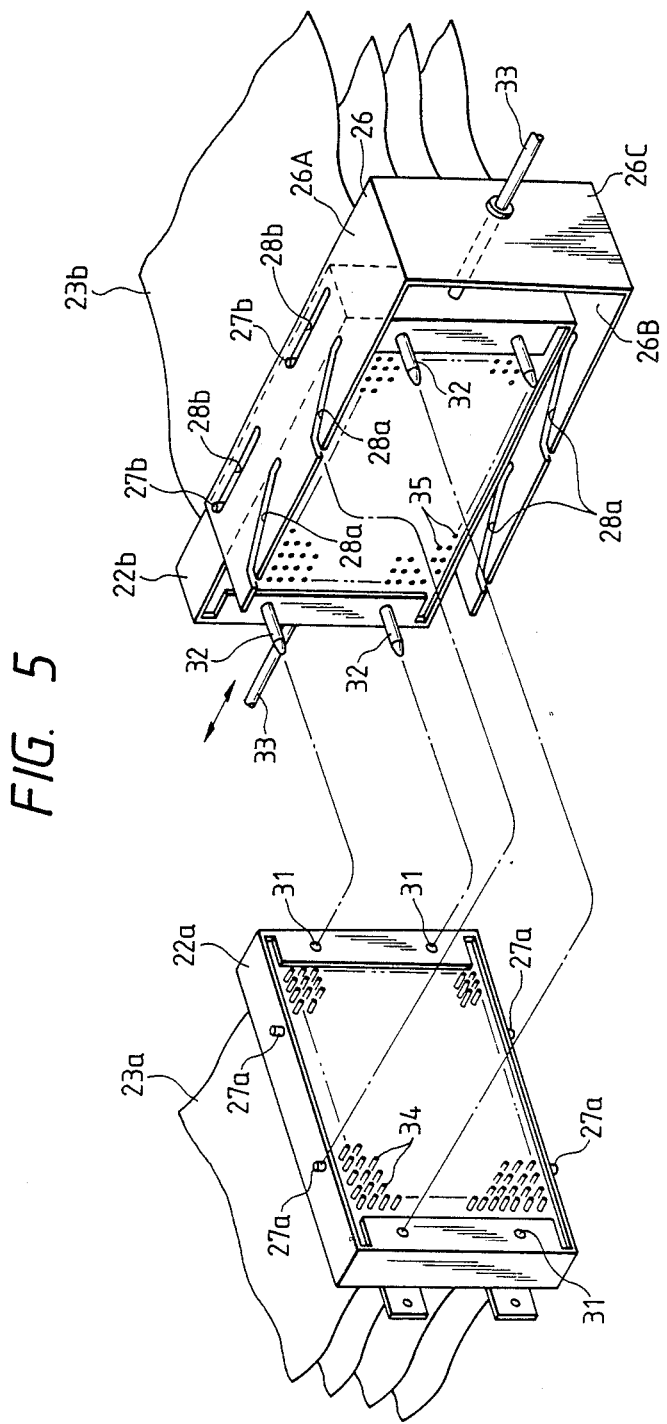
FIG. 5 is a perspective view showing relay connectors 22a and 22b and a driving frame 26 separated from each other.

The relay connectors 22a and 22b of the two back panel systems are detachably connected. As shown in FIG. 5, the relay connector 22a has on its front arrays of contact pins 34 which are connected to conductors of the flat cable 23a, respectively, and engaging pins 27a are provided on top and bottom and both sides of the outer frame of the connector 22a. The connector 22a has holes 21 made in its marginal portions at both sides of the pin arrays 34. In the front of the relay connector 22b receptacle holes 35 in which female contacts (not shown) are housed are made corresponding to the contact pins 34 of the mating relay connector 22a. The relay connector 22b has guide poles 32 planted on its marginal portions at both sides of the receptacle hole arrays 35 and engaging pins 27b on top, bottom and both sides of its outer frame.

A driving frame 26 is slidably mounted on each relay connector 22b although only one driving frame is shown in FIG. 3. The driving frame 26 is made up of three side frame members 26A, 26B and 26C. The top and bottom frame members 26A and 26B have cut therein straight grooves 28b for guiding the engaging pins 27b of the relay connector 22b and oblique grooves 28a for guiding the engaging pins 27a of the relay connector 22a. The oblique grooves 28a are each open at one end, permitting the engagement therewith and disengagement therefrom of the corresponding engaging pin 27a.

As typically depicted in FIG. 4, the driving frames 26 mounted on the relay connectors 22b arranged in the same array are mutually fixed by a drive shaft 33, which is slidably passed through the relay connectors 22b. Consequently, all the driving frames 26 in the same array can be slid on the relay connectors 22b simultaneously by pushing or pulling the drive shaft 33.

The frames 19a and 19b are placed adjacent each other with their relay connectors 22a and 22b held opposite each other, the guide poles 32 inserted in the holes 31 and the engaging pins 27a standing at the open end portions of the oblique grooves 28a. Pulling the drive shaft 32 in the direction of the arrow 36 in FIG. 4, the driving frames 26 slide and the engaging pins 27a are guided by the oblique grooves 28a toward the connectors 22b. As a result of this, the contact pins 34 of the relay connectors 22a are inserted into the receptacle holes 35 of the relay connectors 22b, thus establishing electrical connection between the relay connectors 22a and 22b. The relay connectors 22a and 22b can be disconnected simply by pushing the drive shaft 33 in the direction reverse from that indicated by the arrow 36.

Figure 1:
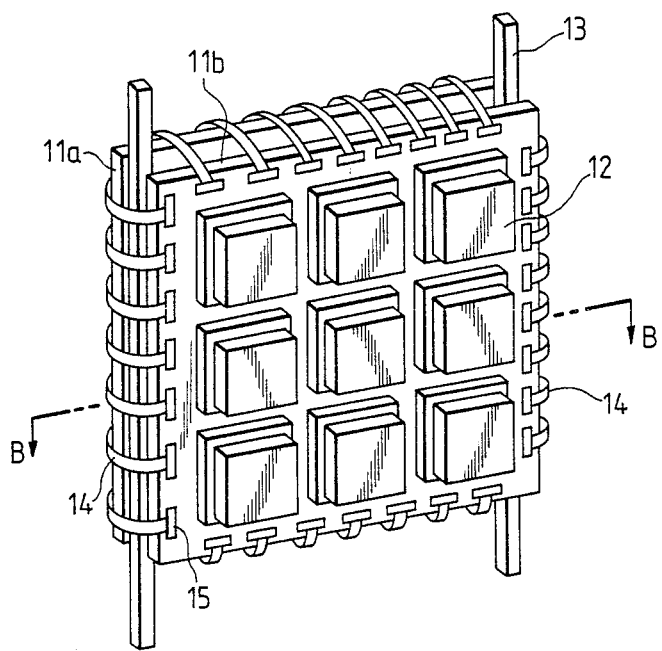
FIG. 1 is a perspective view showing a conventional electronic device packaging structure.
Figure 2:
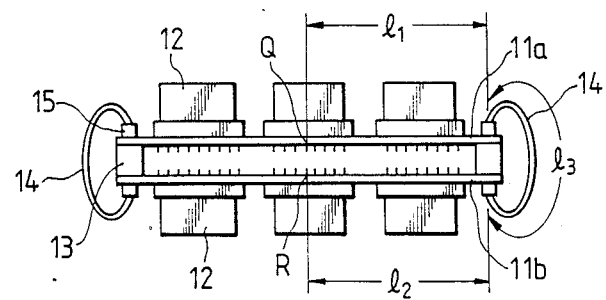
FIG. 2 is a sectional view taken on the line B—B in FIG. 1.

As described above, according to the present invention, the electronic circuit packages 12a and 12b mounted on the opposed back panels 11a and 11b are interconnected via the relay connectors 22a and 22b, the flat cables 23a and 23b and the female connectors 25a and 25b without the need of drawing signal lines around the back panels 11a and 11b, and consequently, the package wiring length can be made appreciably shorter than in the case of the prior art package structure described with regard to FIGS. 1 and 2. The package structure of the present invention can therefore be employed for high-speed electronic devices.

It will be apparent that many modifications and variations may be effected without departing from the scope of the novel concepts of the present invention.

What is claimed is:

1. An electronic device packaging structure comprising:

first and second back panels, each having mounted on its one side a plurality of arrays of electronic circuit packages with their signal input/output terminals projecting out onto the other side;

pluralities of first and second wiring cables connected at one end to connectors connected to the signal input/output terminals of the first and second back panels;

first and second relay connector means connected to the other ends of the first and second wiring cables and detachable from each other; and first and second frames for fixing thereto the first and second relay connector means, the first and second frames being detachably coupled together via the first and second relay connector means.

2. The packaging structure of claim 1, further comprising drive means provided slidably on the first and second relay connector means pairing with each other, for driving them to engage with and disengage from each other.

3. The packaging structure of claim 2, wherein the drive means includes at least one first engaging pin and at least one second engaging pin provided on the first and second relay means, respectively, and a driving frame having cut therein an oblique groove for guiding the first engaging pin and a straight groove for guiding the second engaging pin.

4. The packaging structure of claim 3, wherein the driving frames related to the second relay connector means arranged in the same array are mutually coupled by a drive shaft.

* * * * *